United States Patent [19]

Nelson et al.

[11] Patent Number: 4,931,753

[45] Date of Patent: Jun. 5, 1990

[54] COPLANAR WAVEGUIDE TIME DELAY SHIFTER

[75] Inventors: William W. Nelson, Palo Alto; Camille A. Lesko, Scotts Valley; Andrew M. Kennedy, II, Oakland; Vernon E. Dunn, Milpitas, all of Calif.

[73] Assignee: Ford Aerospace Corporation, Newport Beach, Calif.

[21] Appl. No.: 297,230

[22] Filed: Jan. 17, 1989

[51] Int. Cl.$^5$ ............................ H01P 1/18; H01P 3/08
[52] U.S. Cl. ..................... 333/161; 333/139; 333/164
[58] Field of Search ............... 333/161, 164, 139, 246, 333/116, 128, 156, 157, 238

[56] References Cited

U.S. PATENT DOCUMENTS

| | | | |
|---|---|---|---|
| 3,295,138 | 12/1966 | Nelson | 333/164 X |
| 3,436,691 | 4/1969 | Hoffman et al. | 333/164 |
| 3,568,097 | 3/1971 | Hyltin | 333/161 |
| 4,205,282 | 5/1980 | Gipprich | 333/161 |
| 4,313,095 | 1/1982 | Jean-Frederic | 333/161 X |
| 4,405,907 | 9/1983 | Breese et al. | 333/164 X |
| 4,450,419 | 5/1984 | Schwarzmann | 333/164 |
| 4,458,219 | 7/1984 | Vorhaus | 333/164 |
| 4,471,330 | 9/1984 | Naster et al. | 333/164 |
| 4,568,893 | 2/1986 | Sharma | 333/157 |
| 4,586,047 | 4/1986 | Inacker et al. | 333/164 |
| 4,599,585 | 7/1986 | Vorhaus et al. | 333/164 |
| 4,612,520 | 9/1986 | Boire et al. | 333/156 |
| 4,616,196 | 10/1986 | Sharma | 333/161 |
| 4,647,789 | 3/1987 | Upadhyayula | 307/262 |
| 4,652,883 | 3/1987 | Andricos | 342/372 |

FOREIGN PATENT DOCUMENTS 0041812 3/1985 Japan ..................................... 333/164

OTHER PUBLICATIONS

Gupta et al., "A 20 GHz 5-Bit Phase Shift Transmit Module with 16 dB Gain", *Proceedings of the 1984 IEEE GaAs IC Symposium*, pp. 197–200, 1984.

Riaziat et al., "Coplanar Waveguides for MMICs", *Microwave Journal*, Jun. 1987, pp. 125–131.

*Primary Examiner*—Eugene R. LaRoche
*Assistant Examiner*—Seung Ham
*Attorney, Agent, or Firm*—Edward J. Radlo; Keith L. Zerschling

[57] ABSTRACT

A time delay shifter imparts a constant time delay to an electromagnetic signal, preferably a signal at a microwave frequency, over a band of frequencies. The phase shift imparted to the signal is a linear function of frequency. The shifter comprises a finite number of delay units (1) each having four single-pole single-throw switches (11–14). Closure of the first and third switches (11, 13) causes the signal to traverse a first path (2) containing a preselected length of transmission line that imparts a fixed time delay to the signal. Closure of the second and fourth switches (12,14) causes the signal to traverse a minimum-delay path (3) which is shorter than the delay path (2). The paths (2,3) are fabricated of coplanar waveguide. Each switch (11–14) is resonated by an inductor (21–24) for purposes of increasing isolation. An attenuator (70) is inserted in each minimum-delay path (3).

4 Claims, 4 Drawing Sheets

COPLANAR WAVEGUIDE TIME DELAY SHIFTER

TECHNICAL FIELD

This invention pertains to the field of delaying an electromagnetic signal, particularly one at a microwave frequency, by a preselected amount of time, over a relatively wide bandwidth.

BACKGROUND ART

A prior art search was conducted at the United States Patent and Trademark Office, and uncovered the following references pertaining to phase shifters: U.S. Pat. Nos. 3,436,691; 4,205,282; 4,450,419; 4,458,219; 4,471,330; 4,568,893; 4,586,047; 4,599,585; 4,612,520; 4,647,789; and 4,652,883.

None of the above references employs coplanar waveguide as does the present invention. Coplanar waveguide is a microwave transmission line geometry in which a dielectric substrate supports three coplanar conductors: a center conductor conveying the signal plus two conductive ground plane elements, positioned on either side of the center conductor and separated therefrom by two air gaps having substantially the same width. The present invention's novel use of coplanar waveguide has led to the production of devices offering the following advantages over the prior art: greater accuracy; greater repeatability; lower cost; smaller size; greater ease of handling because the dielectric substrate can be made thicker; greater ease of fabrication because all of the circuitry is on the same side of the dielectric substrate; and circuit elements which are less dispersive, thereby enabling a constant time delay. Since the delay lines are made of top layer metals and are completely testable on wafer, performance of the devices can be verified before packaging.

The present invention also uses switching elements that are resonant at the center operating frequency. This technique, which is not suggested in the above references, offers the following advantages: minimization of the signal to the arm that is not switched; minimization of loading (which would cause unwanted reflections and increased VSWR) on the arm that is switched; and the ability to operate at a higher frequency while maintaining a small size.

Furthermore, most of the reference devices are true phase shifters, in which a constant phase shift rather than a constant time delay is imparted to the signal. This limits the device to a narrow band of frequencies. For one of the major applications of this invention—large, electrically-steerable antenna arrays—such constant phase shifters produce a beam angle that is inversely proportional to frequency, and therefore an unwanted pointing dispersion is the result. The present invention, on the other hand, imparts a constant time delay over a broader band than a phase shifter. The bandwidth is typically 10%. A constant group delay is imparted, which is equivalent to a phase shift that is linear with respect to frequency. For the aforesaid electrically-steerable antenna array application, this advantageously produces a beam angle that is constant for all frequencies of interest.

Gupta et al., "A 20 GHz 5-bit Phase Shift Transmit Module with 16 dB Gain", *Proceedings of the 1984 IEEE GaAs IC Symposium*, pp. 197-200, describes a time delay shifter using switched microstrip delay line and FET switches. This reference does not suggest the use of coplanar waveguide nor inductors used with the FETs to tune to resonance.

An additional reference, which gives a general discussion of coplanar waveguide, is Riaziat et al., "Coplanar Waveguides for MMICs", *Microwave Journal*, June 1987, pp. 125-131.

DISCLOSURE OF INVENTION

The present invention is a time delay shifter that imparts a constant time delay to an electromagnetic signal. The shifter comprises at least one delay unit (1) consisting of first through fourth switching elements (11-14). Closure of the first and third switching elements (11,13) causes the signal to traverse a first path (2) containing a preselected length of transmission line that imparts a fixed time delay to the signal. Closure of the second and fourth switching elements (12,14) causes the signal to traverse a second path (3) shorter than the first path (2). The paths (2,3) are fabricated of coplanar waveguide, i.e., each comprises a thin center conductor lying on a planar dielectric substrate (68), said center conductor being straddled on two sides by coplanar electrically conductive ground plane material (33) separated from said center conductor by two substantially equally wide air gaps (66,67).

BRIEF DESCRIPTION OF THE DRAWINGS

These and other more detailed and specific objects and features of the present invention are more fully disclosed in the following specification, reference being had to the accompanying drawings, in which.

BEST MODE FOR CARRYING OUT THE INVENTION

Figure 1:
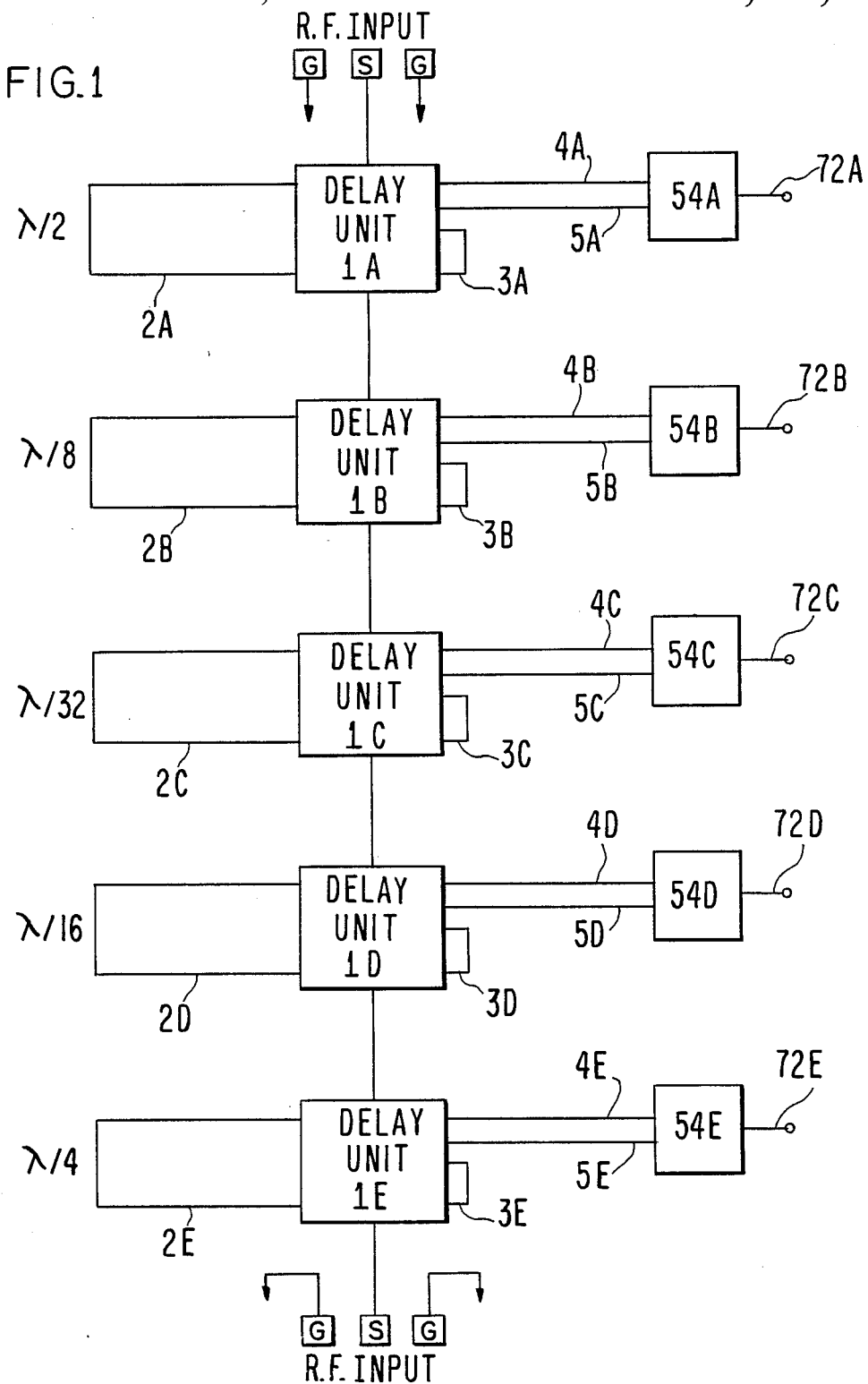
FIG. 1 is a block diagram sketch of a working embodiment of the present invention that has been built and successfully tested, in which five delay units 1A-1E are used.

FIG. 1 illustrates a 5 bit embodiment of the present invention, i.e., there are five delay units 1A-1E. The number of bits is arbitrary and is a function of the desired resolution of the shifter. Each delay unit 1 imparts a different fixed time delay to the incoming signal. The delays are achieved by means of transmission line sections 2 associated with each delay unit 1. Preferably, the lengths of the transmission lines 2 are each equal to the wavelength of the incoming signal divided by a (different) power of 2. In the general case, there are n delay units 1, and the lengths of the transmission lines 2 associated with the delay units 1 are equal to the wavelength divided by $2^j$, where j is an integer ranging from 1 to n, inclusively. The delay units 1 can be placed in any order. The order depicted in FIG. 2 was chosen to minimize the space consumed by the circuit.

On FIG. 1, the input and the output are shown as having three components: a center conductor carrying the signal, denoted by the letter S, and two adjacent grounds straddling the center conductor, designated by the letter G. This conveys the fact that the circuit has been implemented in coplanar waveguide.

Figure 5:
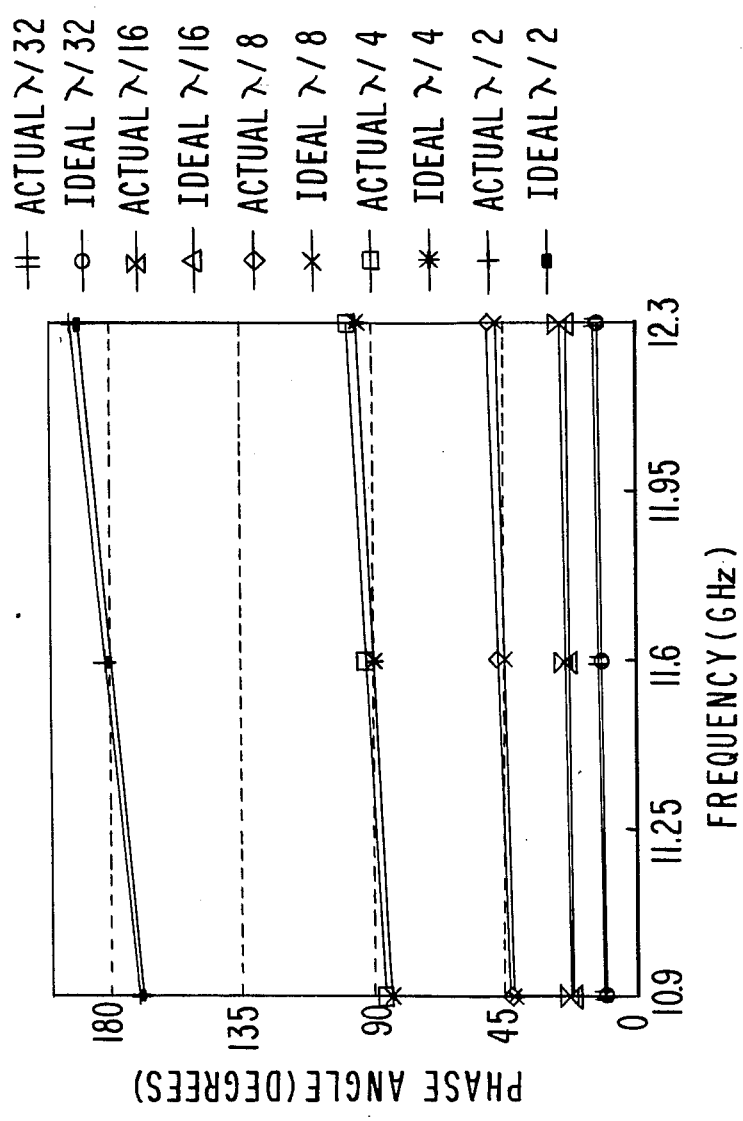
FIG. 5 is a graph of phase angle vs. frequency for the embodiment of the present invention depicted in FIGS. 1 and 2.

The function of each delay unit 1 is to selectively switch the signal through transmission line 2, which imparts a time delay, or through minimum-delay conductor 3. The selection is communicated to each delay unit 1 by a pair of control lines 4,5. By selectively varying the voltages on the control lines 4,5, the user is able to impart 32 different delays to the signal for the illustrated 5-bit embodiment, by means of selectively enabling or disabling each delay path 2. For each combination of enabled delay paths 2, the signal is time delayed by a fixed amount over a band of frequencies. The phase shift as a function of frequency is linear, as illustrated in FIG. 5.

The Figures illustrate a time delay shifter that has been built and successfully tested, using the teachings of the present invention, at a frequency of 12 GHz. An additional working embodiment was built and successfully tested at 20 GHz.

Figure 2:
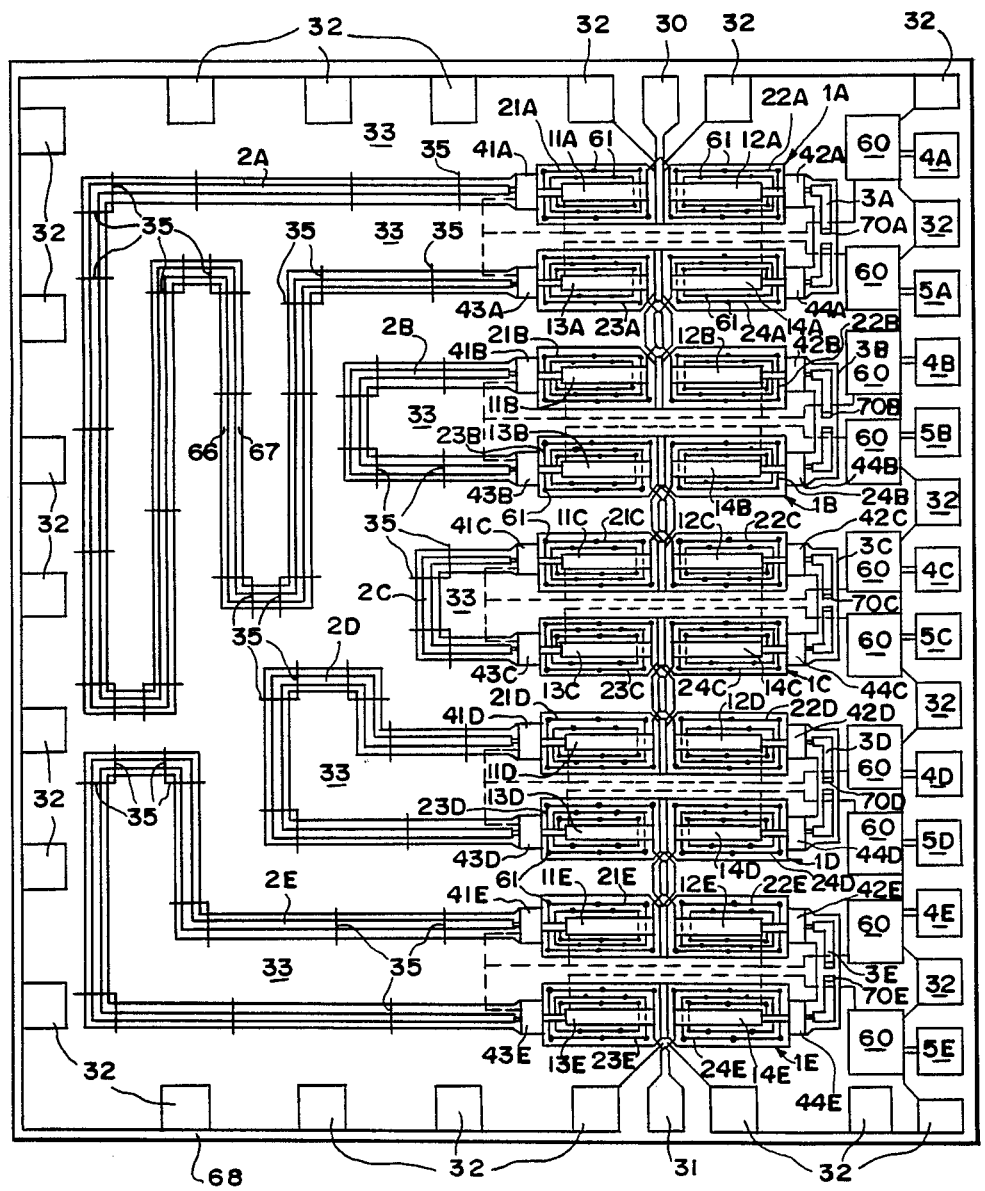
FIG. 2 is a schematic representation of a circuit trace of the embodiment of the present invention illustrated in FIG. 1 (except that control circuits 54 are not on the circuit trace)

A schematic representation of a circuit trace of the 12 GHz embodiment of the invention is shown in FIG. 2. This circuit was built using MMIC (monolithic microwave integrated circuit) techniques on a GaAs substrate 68 having a dielectric constant of 13 and a thickness of 625 microns. The differential time delay at 12 GHz can be as much as 80 picoseconds. Measured wafer-to-wafer difference in electrical delay for the most significant bit (40 picoseconds) was less than 0.1 picosecond.

The reasons that GaAs was selected for dielectric substrate 68 is that GaAs is a lower loss dielectric at high frequencies than competing materials such as silicon. This enables the circuit to be used at very high frequencies, e.g., in the range of 6 GHz to 40 GHz. An additional reason for selecting GaAs for substrate 68 is that this choice of material facilitates the implantation of the FET switches 11-14 and shunt FETs 41-44 on the substrate 68 by conventional techniques.

The thickness of the conductors 2,3 in this circuit is 1.5 microns. In general, the thicker the conductors, the less resistance, which is desirable; however, if the conductors are too thick, fabrication problems ensue. The overall size of the substrate 68 is 2.25 mm×2.50 mm. The width of the conductors 2,3 is 20 microns. The air gaps 66,67 on the opposing sides of the conductors 2,3 are each 14 microns wide. This spacing gives an overall 50 ohm impedance to the transmission lines 2,3. The transmissions lines 2 are non-dispersive, which insures that the time delay imparted to the signal is constant. The circuit is bidirectional in that input 30 and output 31 could be reversed and the circuit would still work.

Since the conductor 2,3 thickness is small compared to conductor 2,3 width, the field distribution is symmetrical about the surface of dielectric 68. As a result, the velocity of propagation is independent of fabrication geometry variation.

Pads 32 are grounded bonding pads which enable external ground connections when mounting the chip. MIM (metal-insulator-metal) capacitors 60 are shunts to ground to purify the d.c. signals entering over control lines 4,5.

Figure 4:
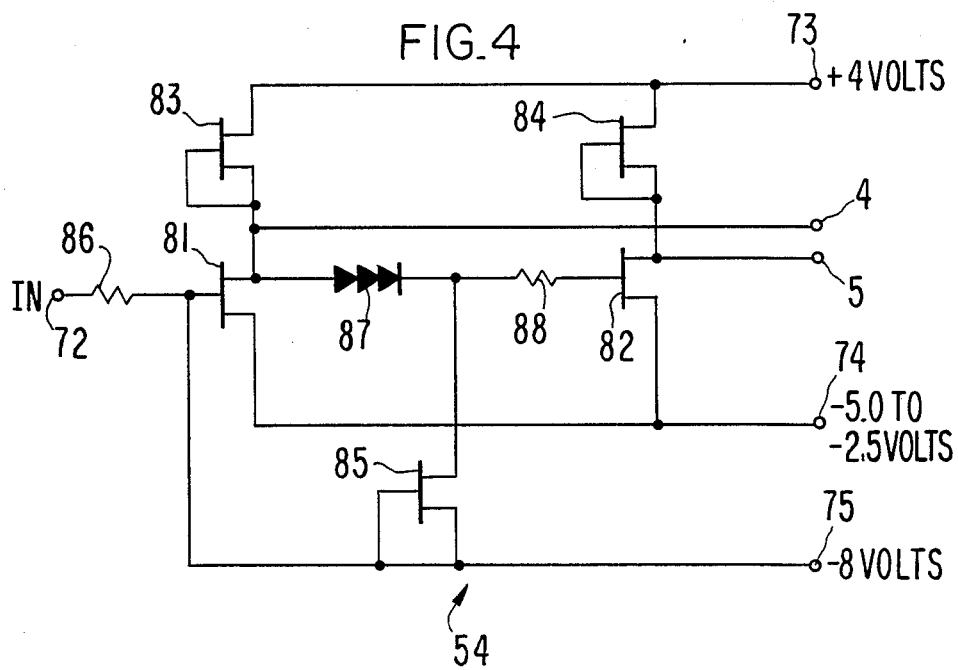
FIG. 4 is a circuit diagram of a preferred embodiment of control circuit 54.

Pads 4,5 are access points for control voltages that may be introduced from an external control circuit, such as control circuit 54 illustrated in FIG. 4. These control signals 4,5 work in tandem: when one is high, the other is low, and vice versa. Circuits 54 could be fabricated on the same chip as the rest of the components.

Each transmission line 2 and minimum-delay path 3 is bridged, approximately every twentieth of a wavelength therealong, by a conductive airbridge strap 35 which electrically connects the two sides of the ground plane material 33 on opposing sides of the conductor 2,3. At corners of the paths 2,3, a pair of straps 35 is used, with the two straps 35 being arranged at right angles to each other. The purpose of the straps 35 is to eliminate stray ground currents induced from the current in the conductor 2,3 in the presence of unequal ground lengths on opposing sides of said conductor 2,3. The straps 35 eliminate crosstalk to the conductors 2,3 from other delay units 1 and, particularly in the case of long transmission lines 2, from one part of the transmission line 2 to another part thereof.

Figure 3:
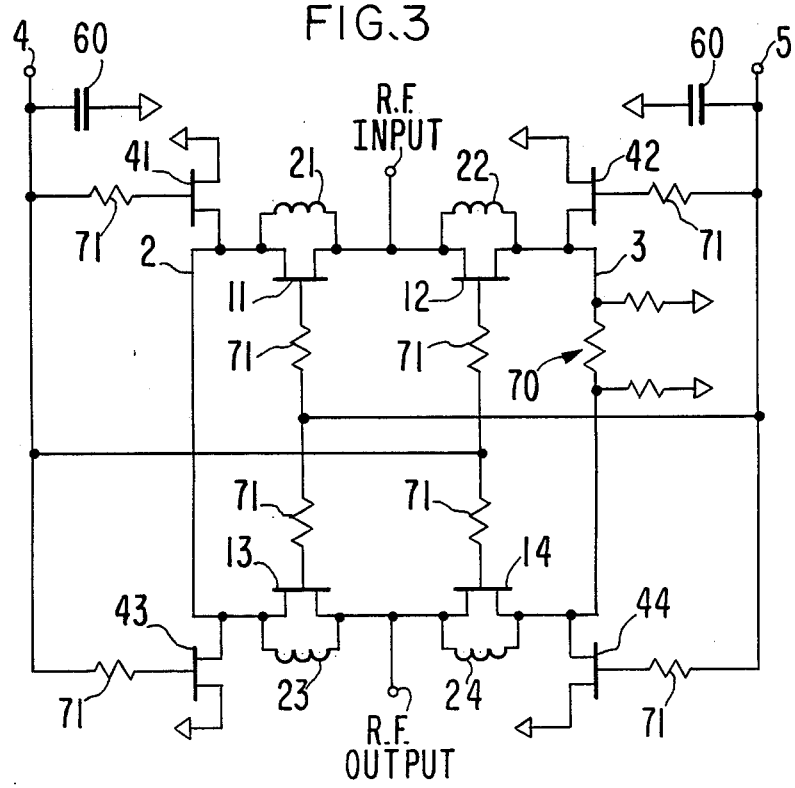
FIG. 3 is a circuit diagram applicable to all of the delay units 1 of FIGS. 1 and 2.

The functioning of the switching within a delay unit 1 can perhaps more readily be understood by examining FIG. 3. It is seen that each delay unit 1 consists of four r.f. FET (field effect transistor) single pole single throw (SPST) switches 11-14, each having a gate (to which the control voltage is applied), a source (constituting one arm of the switch), and a drain (constituting the other arm of the switch). In this embodiment, FETs 11-14 are 0.5 micron by 700 micron interdigitated series FETs. The gate of each is fabricated as one long meander path, a feasible structure where gate resistance is not critical. This in turn allows narrow source and drain fingers and a physically compact switch, compatible with airbridge wraparound inductors 21-24.

The switches 11-14 are switched in pairs. When switches 11 and 13 are closed, switches 12 and 14 are open. This routes the signal through transmission line delay means 2. On the other hand, when switches 12 and 14 are closed, switches 11 and 13 are open. This routes the signal through minimum-delay path 3. Control line 5 governs the switching of switches 11 and 13, while control line 4 governs the switching of switches 12 and 14. Thus, when 4 is high, 5 is low, and vice versa. "High" in the working embodiment is 1 volt, and "low" is −3 volts. The high voltage closes the switches 11-14 and the low voltage opens the switches 11-14.

An additional shunt FET 41-44, respectively, is used in conjunction with each of the primary r.f. FET switches 11-14, respectively. These additional FETs 41-44 have a 60 micron gate width in the preferred embodiment. The purpose of the shunt FETs 41-44 is to ground any unwanted signal and to dampen any resonant effects on the disconnected transmission line when the associated primary FET 11-14 has been switched off. Thus, FETs 42 and 44 are closed when FETs 11 and 13 are closed. This is accomplished by controlling all four of these FETs by the same control line 5. Similarly, FETs 41 and 43 are closed when FETs 12 and 14 are closed. This is accomplished by controlling the switching of all four of these FETs by the same control line 4. A resistor 71 is present in the gate circuit of each of the FETs 11-14, 41-44, to isolate the d.c. control circuit from r.f. signals appearing at the switches' gates. In the working embodiment, each one of these resistors 71 has a value of 7,000 ohms.

An attenuator 70 is inserted in each minimum-delay path 3. The purpose of attenuator 70 is to equalize the amplitude of the signal at the r.f. output port regardless of which path 2,3 the signal has traversed (traversing path 2 will cause it to lose amplitude by means of loss owing to the sheer length of said path 2). Attenuator 70 can have any one of a number of conventional configurations, such as the pi configuration depicted in FIG. 3, a T configuration, etc.

A 1.3 nanohenry inductor 21-24, respectively, is connected in parallel across each primary FET 11-14, respectively. The inductance of each inductor 21-24 is selected to create a resonance condition (at the center frequency of operation) with the capacitance from that FET 11-14 when the FET is open, to provide isolation between the switched arm 2,3 and the unswitched arm 3,2. This advantageously minimizes the signal to the unswitched arm 3,2; minimizes loading (which would cause reflections and increased VSWR) on the switched arm 2,3; and enables operation at a higher frequency while maintaining the small size of the circuit. As shown in FIG. 2, in the preferred embodiment each inductor 21-24 is of the airbridge variety. This makes it geometrically easier to fit the inductor 21-24 around its associated FET 11-14. Such an airbridge inductor 21-24 comprises an elevated spiral of conductive material suspended from dielectric 68 by means of a plurality of conductive posts 61.

The inductance of each inductor 21-24 is a function of the number of turns of the spiral conductor (FIG. 2 shows 2½ turns in the spiral); the height of the air gap; the size (height, width) of the inductor; the size of the conductor; the space between conductors; etc. The calculation of the inductance also takes into account the presence of the shorted outer loop (created by ground material 33 around the inductor 21-24), which lowers the inductance. The combination of each FET 11-14, respectively, and its associated inductor 21-24, respectively, is consistent with coplanar waveguide structure in that this combination is straddled by two equally wide air gaps and two ground planes 33.

By changing the negative control voltage 4,5 from the nominal −3 volt level, the capacitance of the FETs 11-14 can be made to change, which changes their resonant frequency, since the values of the inductors 21-24 are fixed. This effectively changes the center frequency of operation, enabling the time delay shifter to cover a wider range of frequencies, albeit not all at the same time. Means 54 for accomplishing this is depicted in FIG. 4. Control circuit 54 can be fabricated on the same substrate 68 as the primary monolithic circuit, or it can be fabricated on another chip.

Control circuit 54 comprises five d.c. FET switches 81-85 connected as shown in FIG. 4. The high voltage, +1 volt, sent on line 4 or 5 does not vary. If it varied, it would not affect the operation of the circuit, because, as will be recalled, the high voltage closes the switch 11-14. However, the low voltage is made to vary by this control circuit 54. This does affect the operation of the switch 11-14, by changing the capacitance of the FET 11-14 when it is in an open position.

In the working embodiment, the gate widths of FETs 83 and 84 are each 20 microns, the gate width of FET 81 is 30 microns, the gate width of FET 82 is 40 microns, and the gate width of FET 85 is 10 microns. Resistors 86 and 88 each have a resistance of 2,000 ohms. The reference voltage applied at port 73 is 4 volts, and the reference voltage applied at port 75 is −8 volts. These reference voltages are selected based on the material and processes of the five d.c. FETs 81-85.

Circuit 54 works as follows: a binary control signal, having high and low voltage levels, is applied at input port 72. In this embodiment, the high level of signal 72 is zero volts and the low level is −8 volts. Resistor 86 applies the control signal to the gate of FET 81. When the control signal is low, FET 81 is open. The voltage at the upper arm of FET 81 is one volt due to the action of FETs 83 and 84 and the gates of the r.f. switches being controlled.

The voltage on the upper arm of FET 81 is applied through diode chain 87 and resistor 88 to the gate of FET 82. This switches FET 82 on, which causes the voltage on the upper arm of FET 82 to be approximately equal to the voltage on the lower arm thereof, i.e., the variable reference voltage applied at port 74. This variable reference voltage, which is between −5 volts and −2.5 volts, thus goes out on control line 5.

The user changes the variable reference voltage applied to port 74 to change the center frequency of FETs 11 and 13, which are those FETs controlled by control line 5. A more negative voltage increases the band center frequency of the FET 11,13. Thus, a low control voltage applied at input port 72 gives variable center frequency control to FETs 11 and 13. Since control line 4 has one volt on it, switches 12 and 14, which are controlled by control line 4, are closed.

When the control voltage applied at input port 72 is high, FET 81 is closed. This translates the variable reference voltage from port 74 to the upper arm of FET 81. This low voltage is then fed through diode chain 87 and resistor 88 to the gate of FET 82. This voltage is sufficiently low to assure that FET 82 remains open. The voltage on the upper arm of FET 82 is approximately 1 volt due to the action of FET 84 and the gate of the r.f. switch being controlled. This closes the FET switches (11 and 13) controlled by control line 5. Variable center frequency control is imparted to the switches (12 and 14) controlled by control line 4, since control line 4 has the variable reference voltage from port 74 on it, owing to the fact that FET 81 is closed.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A time delay shifter for imparting a constant time delay to an electromagnetic signal, comprising at least one delay unit consisting of first through fourth switching elements; wherein:

each switching element generates a capacitance when said switching element is not closed;

closure of the first and third switching elements causes the signal to traverse a first path containing a preselected length of transmission line that imparts a fixed time delay to the signal;

closure of the second and fourth switching elements causes the signal to traverse a second path shorter than the first path;

the paths are fabricated of coplanar waveguide, each comprising a thin center conductor lying on a planar dielectric substrate, said center conductor being straddled on two sides by coplanar electrically conductive ground plane material separated from said center conductor by two substantially equally wide air gaps;

an inductor is positioned in the vicinity of each switching element, said inductor having an inductance which has been preselected to create, at the center frequency of operation, resonance with the capacitance generated by said switching element when said switching element is not closed; and each inductor comprises a conductive element, generally in the shape of a spiral, positioned over the switching element and elevated from the dielectric substrate by a plurality of conductive posts.

2. A time delay shifter for imparting a constant time delay to an electromagnetic signal, comprising at least one delay unit consisting of first through fourth switching elements; wherein:

closure of the first and third switching elements causes the signal to traverse a first path containing a preselected length of transmission line that imparts a fixed time delay to the signal;

closure of the second and fourth switching elements causes the signal to traverse a second path shorter than the first path;

the paths are fabricated of coplanar waveguide, each comprising a thin center conductor lying on a planar dielectric substrate, said center conductor being straddled on two sides by coplanar electrically conductive ground plane material separated from said center conductor by two substantially equally wide air gaps;

each switching element is a field effect transistor (FET) having a gate, a source, and a drain;

a control voltage having a high level for closing the FET and a low level for opening the FET is applied to the gate; and the low level component of the control voltage is variably preselected based upon the amount of capacitance, and thus the resonant frequency, desired to be associated with said FET.

3. The time delay shifter of claim 2 further comprising a control circuit associated with each delay unit for varying the amount of control voltage applied to the switching element FETs of said delay unit, said control circuit comprising:

a first d.c. switch having a control input and first and second arms; and a second d.c. switch having a control input and first and second arms; wherein:

a binary d.c. control signal is applied to the control input of the first d.c. switch;

a variable reference voltage, adjustable based upon the desired resonant frequency of the FETs of the associated delay unit, is applied to the second arm of the first d.c. switch and to the second arm of the second d.c. switch;

the first arm of the first d.c. switch is coupled to the control input of the second d.c. switch; and the first arm of the second d.c. switch is coupled to the gates of two of the FETS of the associated delay unit.

4. A time delay shifter for imparting a constant time delay to an electromagnetic signal, comprising at least one delay unit consisting of first through fourth switching elements; wherein:

closure of the first and third switching elements causes the signal to traverse a first path containing a preselected length of transmission line that imparts a fixed time delay to the signal;

closure of the second and fourth switching elements causes the signal to traverse a second path shorter than the first path;

the paths are fabricated of coplanar waveguide, each comprising a thin center conductor lying on a planar dielectric substrate, said center conductor being straddled on two sides by coplanar electrically conductive ground plane material separated from said center conductor by two substantially equally wide air gaps;

a group of airbridge conductors is positioned over each transmission line at several generally equispaced points therealong, each airbridge conductor having first and second ends and electrically connecting two sections of conductive ground plane material situated on opposite sides of said transmission line;

the coplanar waveguide forms at least one substantially 90° angle; and for each 90° angle formed in the coplanar waveguide, the two airbridge conductors nearest to said 90° angle are orthogonal to each other and have their first ends connected to each other.

* * * * *